United States Patent [19]
Robinson

[11] Patent Number: 4,691,190
[45] Date of Patent: Sep. 1, 1987

[54] ANALOG-DIGITAL CONVERTER

[75] Inventor: Jeffrey I. Robinson, New Fairfield, Conn.

[73] Assignee: General DataComm, Inc., Middlebury, Conn.

[21] Appl. No.: 7,715

[22] Filed: Jan. 28, 1987

Related U.S. Application Data

[62] Division of Ser. No. 822,396, Jan. 27, 1986, Pat. No. 4,667,180.

[51] Int. Cl.⁴ .............................................. H03M 1/44
[52] U.S. Cl. .......................... 340/347 AD; 324/76 A; 324/49 D; 340/347 M; 340/347 SH
[58] Field of Search ....... 340/347 AD, 347 M, 347 C, 340/347 NT, 347 CC, 347 SH; 324/99 D, 76 A

[56] References Cited

U.S. PATENT DOCUMENTS 3,541,446 11/1970 Prozeller ..................... 340/347 AD
3,579,231 5/1971 Bylanski ...................... 340/347 AD

OTHER PUBLICATIONS

The Engineering Staff of Analog Devices, Inc., Analog-Digital Conversion Handbook, 6/1972, pp. II-12 to II-17.

Primary Examiner—T. J. Sloyan
Attorney, Agent, or Firm—David P. Gordon

[57] ABSTRACT

An A-D converter for providing the general successive rectification algorithm $V_{out} = 2|V_{in}| - V_{ref}$ is disclosed. One stage of a synchronous parallel converter generally comprises a comparator, and an op amp with $V_{in}$ as an input to its inverting input, the noninverting input connected to ground, and the output being $V_{out}$, with a first capacitor bridging the inputs of the op amp, and a second capacitor of half the capacitance of the first capacitor feeding back from the output of the op amp to its noninverting input. The location and capacitance values of the first and second capacitors perform the amplification function. Switches between the first capacitor and the op amp provide rectification, while a third capacitor between $V_{ref}$ and the inverting input of the op amp provides the function of subtracting $V_{ref}$. Stages are cascaded such that $V_{out}$ of one stage is the $V_{in}$ of the next stage. Each stage's $V_{in}$ is compared to ground to provide a bit of information. A shift register having a storage capacity of m bits is associated with each stage where m is the number of the particular stage.

6 Claims, 4 Drawing Figures

ANALOG-DIGITAL CONVERTER

A divisional application of Ser. No. 822,396 filed Jan. 27, 1986 which is hereby incorporated by reference herein, now U.S. Pat. No. 4,667,180.

BACKGROUND

The present invention relates to an apparatus for converting analog signals to digital signals. The invention more particularly relates to circuitry for converting analog signals to digital signals in a discrete time domain.

Many different types of analog to digital converters are known in the art. Perhaps the most common analog to digital converters are the successive approximation converters, the flash converters, and the dual slope converters. Each have their advanctages and disadvantages. For example, the successive approximation converters typically permit accurate conversion to at least twelve bits, but are only of medium speed and in certain embodiments require digital to analog converters having $2^n$ capacitors, where n is the number of bits in the output word. The flash converters are much faster than the successive approximation converters, but require $2^{n-1}$ comparators, thus making them costly in terms of components. Moreover, flash converters have an accuracy of at most nine bits of resolution. Finally, while permitting finer resolution and fewer components, the dual slope converters are considered much too slow for most applications.

Another analog to digital converter called a recirculating-cyclic converter or serial successive rectification converter is known in the art. It uses a cyclic, or stage-by-stage conversion algorithm originally employed in high-speed, low resolution applications, and is described in an article by Doug Rife entitled "High Accuracy with Standard ICs: An Elegant ADC's Forte", EDN, Apr. 28, 1982 pp. 137-144. Basically, according to the article, the input signal is compared to a midpoint (ground) to see which half of the permitted range it is in. A first bit of information is determined thereby. The input is then rectified, multiplied by two, and a reference voltage is subtracted therefrom through the use of an operational amplifier and resistor network. The voltage output $V_{out}$, which is equal to $2|V_{in}| - V_{ref}$ is then recirculated to the input end where a second bit is determined by the comparator and the signal is again rectified, multiplied by two, and decreased by the reference voltage. The output is again recirculated, and in this manner, as many bits of resolution as desired may be obtained without increasing the component count. The cycle and resolution are controlled by the sampling timing. The Gray code output of the comparator of the circuit is converted into binary code through the use of an exclusive NOR gate.

The advantage of the serial successive rectification analog to digital converter is the reduction in the number of components required for conversion. Indeed, with recirculation, additional bits of resolution may be obtained without increasing the numbers of components used. However, the serial successive rectification converter is still only of medium speed, as each additional bit of resolution requires an additional cycle of processing.

SUMMARY OF THE INVENTION

It is therefore an object of the invention to provide a successive rectification converter in a parallel format which permits a fast high resolution analog to digital conversion.

In accord with the object of the invention, a synchronous parallel successive rectification converter comprises:

(a) a plurality of stages for performing the conversion algorithm $V_{out} = 2|V_{in}| - V_{ref}$, wherein $V_{in}$ is the voltage to the input of a particular stage, $V_{out}$ is the voltage at the output of that stage and becomes the $V_{in}$ to the following stage, and $V_{ref}$ is a chosen reference voltage, each stage comprising
  (i) a comparator means for comparing $V_{in}$ with a second reference voltage for obtaining a bit of information,
  (ii) a first input sampling capacitor,
  (iii) a second feedback capacitor, wherein the capacitance of said first input sampling capacitor is twice that of said feedback capacitor,
  (iv) a third switch capacitor,
  (v) a switching network for permitting the charging and discharging of said input sampling capacitor, said feedback capacitor, and said switch capacitor according to predetermined clocking,
  (vi) an operational amplifier having said input sampling capacitor bridging its inverting and noninverting inputs via said switching network, and said feedback capacitor feeding back from the operational amplifier output to its inverting input, wherein
said switching network is arranged to switch the connections of the plates of said sampling capacitor to said operational amplifier inputs as a function of said clocking and said obtained bit of information to effectuate rectification of $V_{in}$, and wherein said switching network is arranged to switch the connection of said switch capacitor as a function of said clocking from being connected to the output of said operational amplifier to being between the source of said chosen reference voltage and said inverting input of said operational amplifier, and (b) a plurality of shift registers, each shift register corresponding to a particular stage and having a storage capacity of m bits of information, where m is chosen from $\emptyset$ to $n-1$ and is the number of said paticular stage with $n-1$ representing the most significant bit and $\emptyset$ representing the least significant bit, wherein n is the number of bits output by said analog to digital converter, wherein the output of said shift registers provides an output word in Gray code.

In one embodiment, means for converting said Gray code output word into a binary code output word are included. Typically such means comprises exclusive OR or NOR gates.

A better understanding of the invention, and additional advantages and objects of the invention will become apparent to those skilled in the art upon reference to the detailed description and the accompanying drawings.

BRIEF DESCRIPTION OF THE DRAWINGS

FIG. 2 is an illustration of the Gray code decision thresholds resulting from the successive rectification converter of FIG. 1a;

DETAILED DESCRIPTION OF THE PREFERRED EMBODIMENTS

Figure 1A:
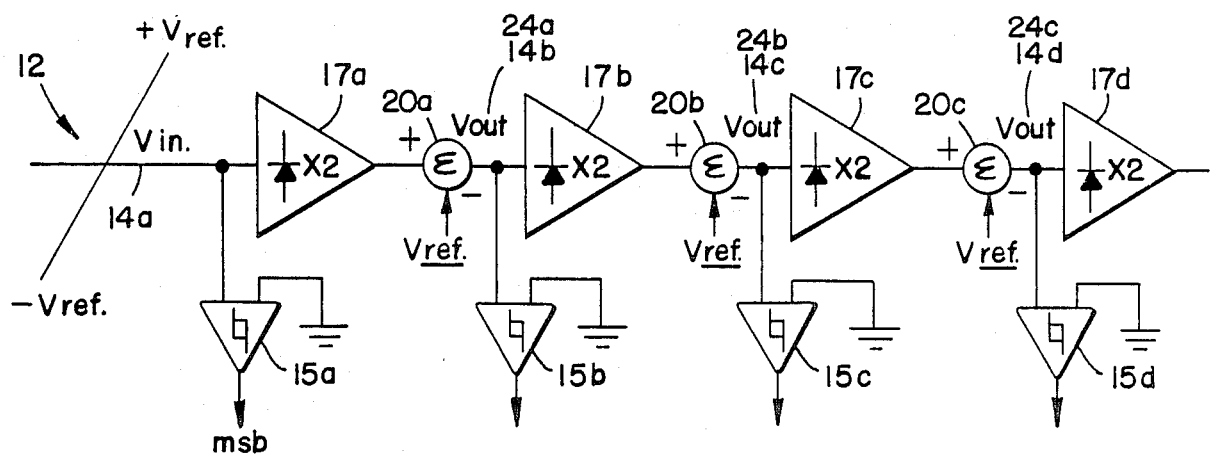
FIGS. 1a and 1b are respectively a block diagram of the successive rectification algorithm of the prior art, and a schematic of the waveforms resulting therefrom.

Turning to FIG. 1a, a block diagram of the successive rectification converter algorithm of the art is shown. As seen at 12, a sampled analog signal $V_{in}$ 14a having a voltage between $-V_{ref}$ and $V_{ref}$ is compared to another reference voltage (ground) by comparator 15a. A first bit of information as to whether the sampled voltage is positive or negative is obtained thereby. The input voltage is then rectified and amplified by a factor of two at rectifier-amplifier 17a, and $V_{ref}$ is subtracted from the resulting voltage at summing junction 20a to obtain $V_{out}$24a. $V_{out}$24a may be considered to be the input voltage 14b to the second stage of the analog-digital converter. The process may then be repeated, with a second bit of information being obtained by comparing the new $V_{in}$ 14b to ground at comparator 15b. The new input voltage 14b is then rectified and amplified by a factor of two at rectifier-amplifier 17b, and $V_{ref}$ is subtracted from the resulting voltage at adding junction 20b to obtain $V_{out}$ 24b. The same process may be repeated as many times as desired in multiple identical stages to obtain as many bits of resolution as is required. Alternatively, the $V_{out}$ of the first stage may be recirculated back as a new input to the first stage provided proper clocking and switching are utilized.

Figure 1B:
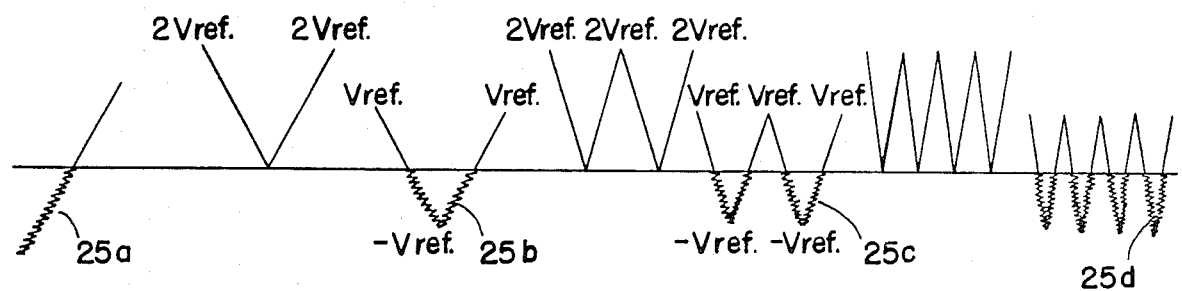
Figure 2:
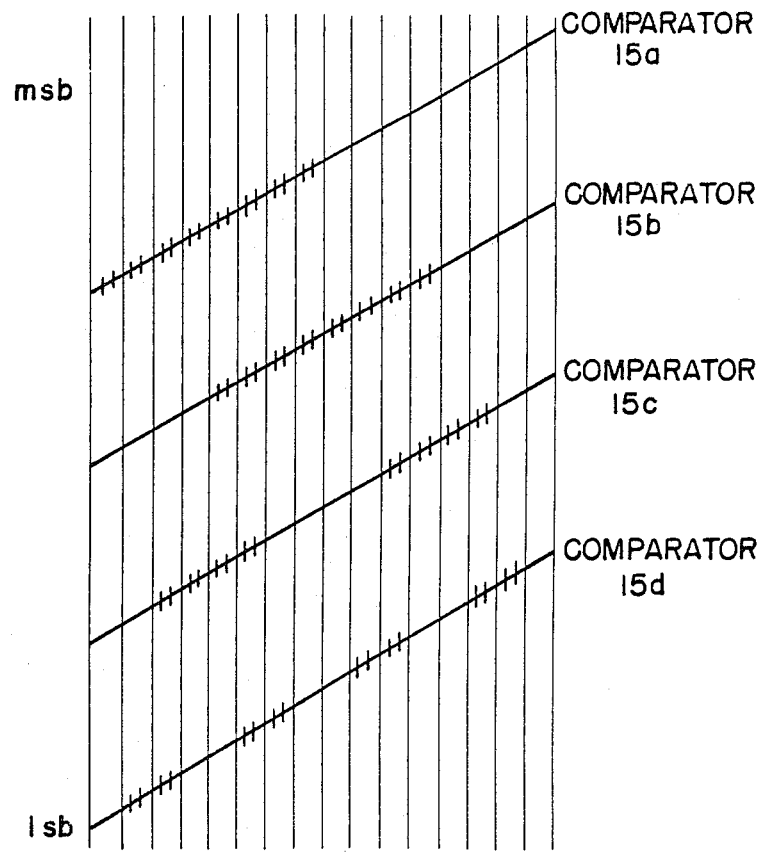

Those skilled in the art will appreciate that the amplification of the signal accomplished by the successive rectification converter avoids the problems of the successive approximation converters and flash converters of the art where signal amplitudes are attenuated and descend to the millivolt or microvolt region depending on the amount of resolution desired. Indeed, the effect of the rectification, amplification and subtraction is to fold the input signal about zero volts as seen at 25a in FIG. 1b. The repeated folding of the input signal at 25a, 25b, ... divides the input signal into $2^n$ segments, where n is the number of bits of resolution desired, and n−1 is the amount of stages required. Any input may then be represented in a Gray code according to the region in which it falls. For example, as seen in FIG. 2 a decision threshold chart may be arranged where the shaded region for each comparator signifies a negative value while the unshaded region designates a positive value. The shading for each comparator may respectively be taken from signals 25a, 25b, ... of FIG. 1b. With four bits of resolution, an input voltage may be said to lie in one of sixteen unique segments. Each segment may then be represented by reading the threshold chart and assigning a zero to shaded regions and a one to unshaded regions. It will be recognized that a Gray code output results, with the lowest input coded as 0111, the next intput coded as 0110, etc. The most positive value would be coded as 1111.

The Gray code output of FIG. 2 can be effecienty converted into a binary output if required. One method of converting the code would be to use a look-up chart (e.g. a ROM). Another approach requires that a word of code be read from the most significant bit to the least significant bit. If the inspected bit is a one, then the next bit remains unchanged. If the inspected bit is a zero, then the next bit is inverted. Thus, it will be seen that the lowest input, which was coded as 0111 in the Gray code, will be converted to 0000. The first "1" is inverted by the zero in front of it, leaving 0011. The resulting zero of the second bit then inverts the third bit's "1" into a zero, which in turn inverts the last bit, leaving 0000. Likewise, the second lowest value will become 0001, as the two "1"'s will be inverted into zeroes, and the zero in the lsb will be inverted into a "1". Those skilled in the art will appreciate that such an operation may be realised by taking the exclusive NOR of the current bit and its predecessor to form the new current bit.

Figure 3:
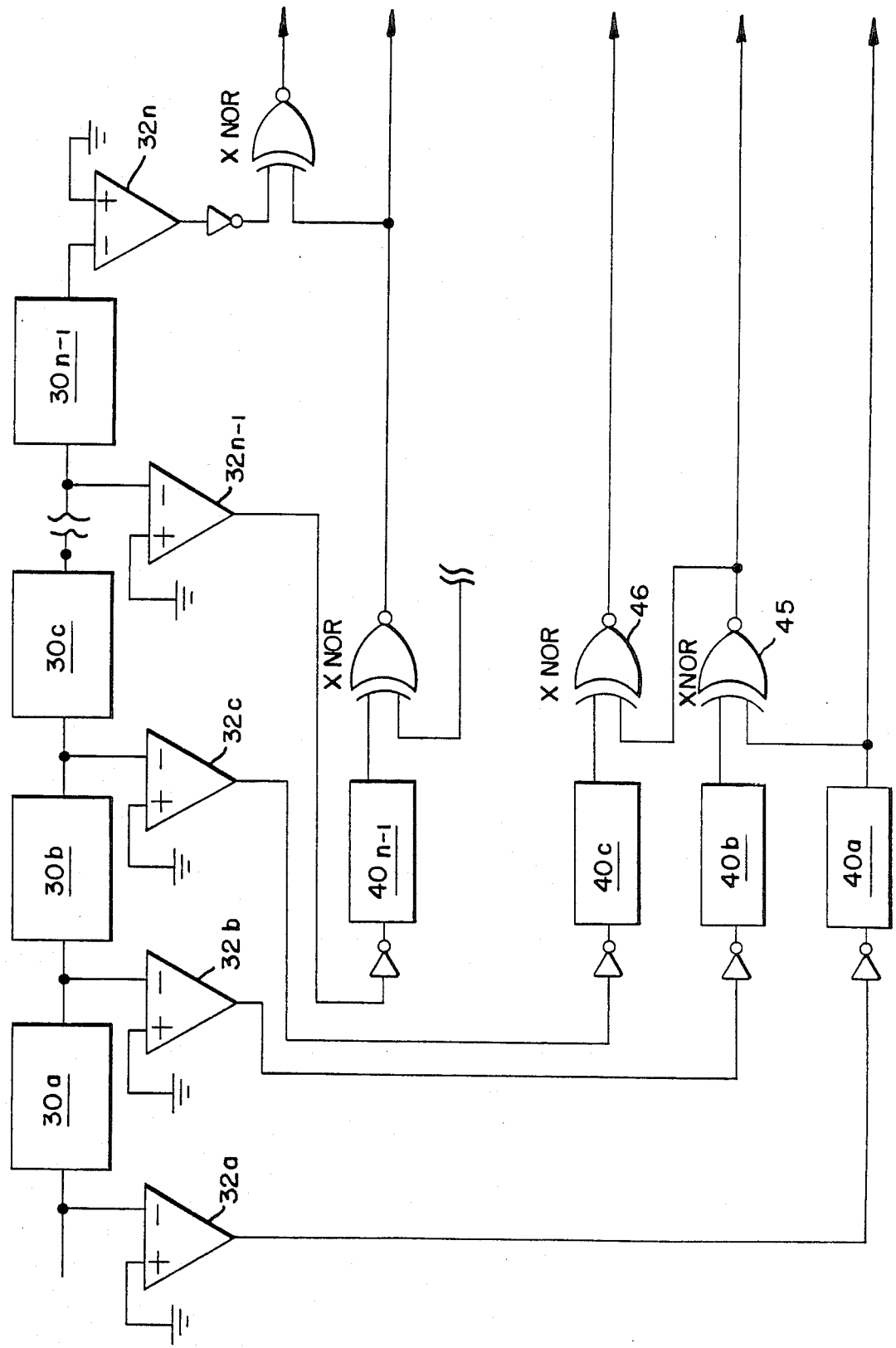
FIG. 3 is a block diagram of the parallel synchronous successive rectification converter of the invention.
Figure 4:
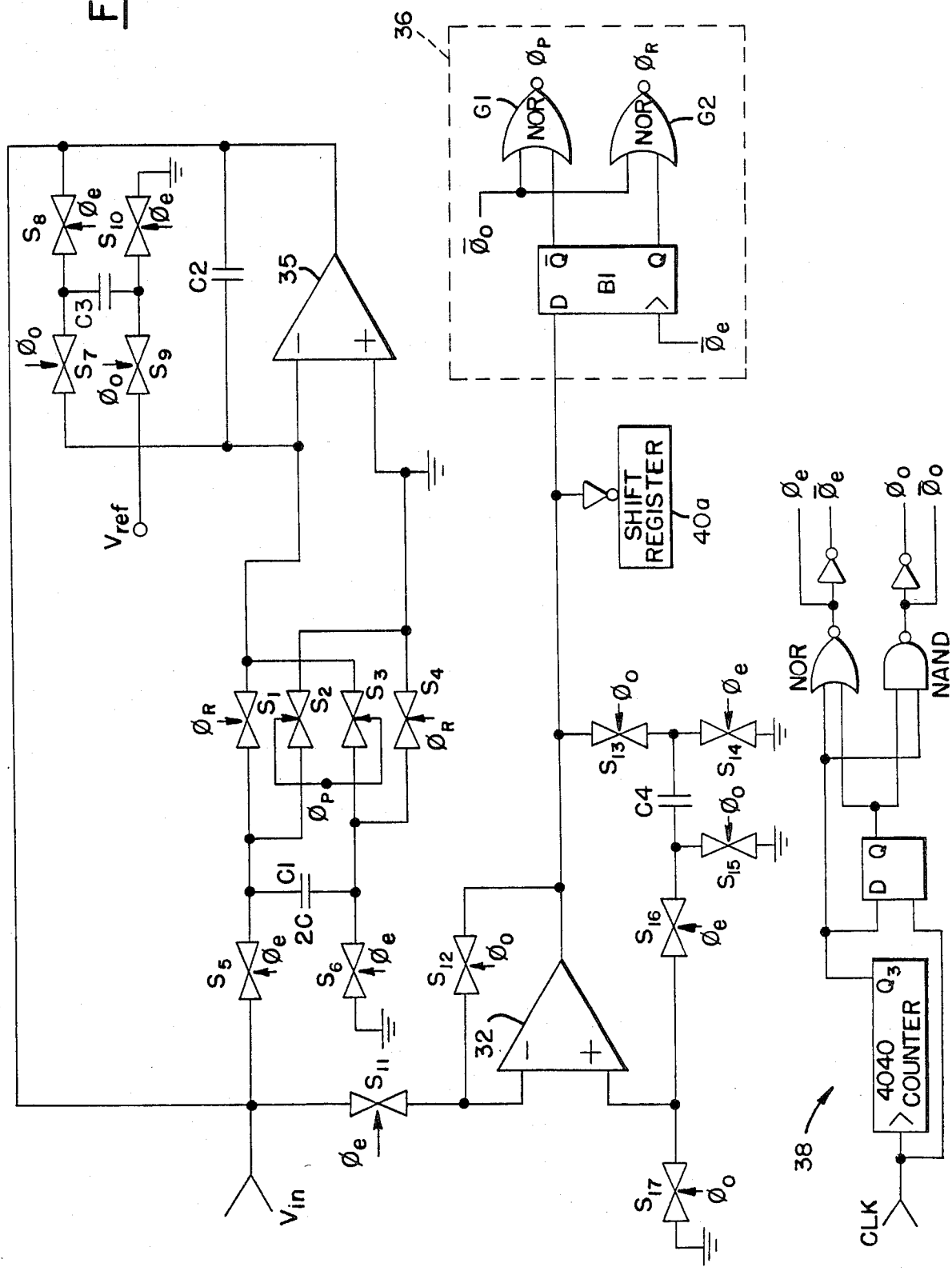
FIG. 4 is a schematic of the circuitry of one stage of the parallel synchronous successive rectification converter of FIG. 3, and the logic associated therewith.

An implementation of the successive rectification converter algorithm in a parallel synchronous form according to the invention is seen in block diagram form in FIG. 3. One stage 30a for performing the conversion algorithm $V_{out}=2|V_{in}|-V_{ref}$, is shown in FIG. 4 and comprises a comparator 32, op amp 35, an input sampling capacitor C1, a feedback capacitor C2, a switch capacitor C3, switches S1 through S10, logic circuitry 36, and clock generator 38. As will be described in more detail below, a first bit of information is obtained by comparing the voltage $V_{in}$ to ground. Then, when switches S5 and S6 are opened, input sampling capacitor C1 is charged up to $V_{in}$. When the charge of C1 is released by C1 through a rectifier comprised of switches S1 through S4, the feedback capacitor C2 is charged to twice the absolute value of $V_{in}$, because the capacitance of C1 is arranged to be twice that of C2. Simultaneously, capacitor C3 is connected to the inverting op amp side of capacitor C2 and because capacitor C3 sees a voltage $V_{ref}$, the voltage over C2 is decreased by the value of $V_{ref}$ when C2 has has a capacitance equal to C3. In this manner, a $V_{out}$ equal to $2|V_{in}|-V_{ref}$ is provided. The voltage output of the first stage 30a becomes the voltage input into stage 30b where identical circuitry performs the identical function. The logic for controlling the switches of stage 30a is seen as gates G1 and G2, flip-flop B1 and clock circuitry 38. Those skilled in the art will recognize that only one clock generator is required to control as many algorithm performing stages 30a, 30b, 30b ... as are being utilized. However, each stage requires the equivalent of gates G1 and G2 and flip-flop B1.

According to the parallel synchronous embodiment, the information bit outputs of the comparators 32 of each stage are inverted (as the inputs were originally sent to the inverting input) and sent to shift registers 40a, 40b..., as seen in FIG. 3. The storage capacity of shift register 40a is preferably arranged to be m bits of information, where m equals n−1 for the most significant bit and 0 for the least significant bit, and where n is the number of bits of resolution being utilized, and n−1 is the number of stages utilized. Thus, it will be understood that no shift register is required for the information determined by a last comparator located at the output of the last stage, as the shift register would have zero storage capacity.

In operation, a sample of an analog voltage signal having voltage $V_{in}$ is provided to the negative input of comparator 32 and compared to ground. Switches S11–S17 and capacitor C4 are provided in conjunction with comparator 32 to eliminte offset problems and to take the criticality out of the design of the comparator 32. A first bit of information is obtained from comparator 32 and sent to shift register 4∅a and to logic circuitry 36, and in particular to the D input of flip-flop B1. When non-overlapping clock generator 38, which is comprised of a clock input, a negatively edge triggered binary counter 42, a positively edge triggered flip-flop B2, NOR gate G3, NAND gate G4 and invertors G5 and G6, provides an even phase, switches S5 and S6 are closed and capacitor C1 is charged up to a voltage of $V_{in}$ as switches S1–S4 are all open.

On the negative edge of the even phase, the not even phase input into B1 goes high, causing whatever information is at D to be transferred to not Q. If $V_{in}$ is greater than ground, the output from comparator 32 is low as is the not Q output of B1. Conversely, the Q output of B1 goes high causing NOR gate G2 to be low, thereby leaving switches S1 and S4 open. Meanwhile, with the not Q output of B1 being low, when the odd phase starts (clock generator 38 is non-overlapping), the not odd phase goes low, causing NOR gate G1 high and resulting in the closing of switches S2 and S3. If $V_{in}$ was negative, G1 would go low and G2 would go high, thereby causing switches S1 and S4 to close and switches S2 and S3 to open. Those skilled in the art will appreciate that this combination of switches and logic acts to rectify the $V_{in}$ signal by switching the connection of the plates of capacitor C1 to the op amp 35, and thereby causing a $-V_{in}$ voltage to appear at the inverting input of op amp 35.

As stated above, when switches S1 and S4 or S2 and S3 close, the voltage $-V_{in}$ is seen at the inverting input of op amp 35. In response, the op amp immediately causes its output voltage to swing high, thereby pulling a current. In this manner, the charge stored on C1 is transferred to capacitor C2, ultimately leaving the potential across C1 at zero and thereby bringing the inverting input of op amp 35 to ground. When the voltage at the inverting input of op amp 35 reaches ground, the system is in equilibrium. Because C1 is arranged to have a capacitance twice that of C2, in equilibrium, the voltage at the output of op amp 35 and across C2 becomes twice that of the former voltage across C1 (i.e. $2|V_{in}|$). Thus, the arrangement of providing an operational amplifier with an input sampling capacitor C1 bridging (via switching network S1–S4) its inverting and noninverting inputs, and a feedback capacitor C2 feeding back from the operational amplifier output to its inverting input, permits the rectified $V_{in}$ signal to be amplified by a factor of two at the output of op amp 35.

When the odd phase is high, not only does the charge on capacitor C1 get transferred to C2, but switches S7 and S9 close causing the final aspect of the successive rectification algorithm to be performed simultaneously. When switch S9 is closed, the voltage of $V_{ref}$ appears at one plate of capacitor C3 thereby causing the other to charge to $V_{ref}$. In response to the non-zero voltage ($V_{ref}$) appearing at its inverting input, the voltage output of op amp 35 swings low causing current to flow until an equilibrium is reached. In essence, when the capacitance of C2 and C3 are equal, the equilibrium due to $V_{ref}$ is reached when the voltage at the output of op amp 35 and across C2 is decreased by $V_{ref}$. The decrease of voltage across capacitor C2 causes the inverting input of operational amplifier 35 to ground. Thus, the voltage at the output of op amp 35 becomes $2|V_{in}| - V_{ref}$. This output voltage is then fed into stage 3∅b as the input voltage of that stage, where it is tested by a comparator to see whether it is a positive or negative voltage. As aforedescribed, the determination of the comparator provides another bit of information which is sent to shift register 4∅b. The voltage input is then processed by identical circuitry and fed successively into additional identical stages. In order to provide n bits of resolution, the analog signal $V_{in}$ must be processed my n−1 stages, and a comparator 4∅n must be located at the output of the last stage.

Those skilled in the art will appreciate that the arrangement of C2 and C3 and switches S7–S1∅ also provide a voltage cancelling function to permit the performance of the algorithm. Thus, after C3 and C3 have been charged to $V_{out}$ and $V_{ref}$ respectively, and a new cycle starts, C3 is charged to $V_{out}$ during the even phase because switches S8 and S10 are closed. Since $V_{out}$ refers to the voltage of the previous cycle, it may also be designated as $V_{old}$. When the new odd phase starts, C2 is actually charged to $2|V_{in}| + V_{old} - (V_{ref} + V_{old})$. It will be appreciated that the old voltages across the capacitors cancel out to provide the desired result.

Those skilled in the art will also understand that according to the best mode, the switches S1–S1∅, gates G1 and G2, and flip-flop B1 of each successive stage are triggered by opposite phases. Thus, in stage 3∅b, switches S5 and S6 are preferably closed during the odd phase when a $V_{out}$ is being determined and provided by stage 3∅a, thus permitting the sampling capacitor C1 of stage 3∅b to charge to the $V_{out}$ voltage of stage 3∅a. Likewise, gates G1 and G2 which control switches S1–S4 would be triggered by the start of the even phase (not even phase going low). Also switches S7 and S9 would close during the even phase, while switches S8 and S1∅ would close during the odd phase.

As aforedescribed, the shift registers 4∅ associated with the various stages 3∅, have a storage capacity of m bits of information with m ranging from n−1 to ∅. Thus, the shift register 4∅a associated with stage 3∅a, which is actually located before the processing circuitry, has a storage capacity of n−1 (or seven) bits, while the shift register 4∅b associated with stage 3∅b has a storage capacity of n−2 (six) bits of information. In an eight bit converter, the sixth stage would have a shift register storage capacity of two bits of information, and the last stage (m=1) would have a shift register with a single bit capacity. The output of the seventh stage would then be fed to a comparator without a concomitant stage and without a shift register. This last comparator would provide the least significant bit of information.

It should be appreciated that each stage 3∅ will take an identical length of time to provide a voltage output equal to twice the absolute value of the input voltage minus the reference voltage. Thus, while the second stage 3∅b is processing the input voltage provided by the first stage to provide an output voltage, the first stage 3∅a will be processing a second sample of the analog input. Indeed, those skilled in the art will recognize that if stage 3∅a, which (before processing) provides the most significant bit of information (the "t=∅ bit") is said to provide the same at time t=∅, the second stage, 3∅b will compare the output of stage 3∅a and provide a second bit of information at time t=1. The last stage processes the t=∅ sample and sends it to a comparator at time t=7, at which time the first stage is sampling and providing its eighth bit of information. Because shift register 40a has a storage capacity of only seven bits, the t=∅ sample bit of information is output by shift register 40a at the identical time (t=7) that the last stage outputs its "t=∅ bit" of information. Likewise, all of the intermediate shift registers $40b$, $40c$ . . . simultaneously output their $t=0$ bit of information. Thus, an eight-bit digital Gray code word representing a sample of an analog signal is provided by the shift registers $40a$, $40b$ . . . for each time period. In other words, after seven time periods, the invention permits the production of an eight bit word of information approximately eight times as fast as the recirculating or serial successive rectification converters of the prior art. Of course, sixteen bit words could be produced sixteen times as fast. It should be understood that it is not intended that the invention be limited to eight bit and sixteen bit situations, but rather that the invention encompasses parallel synchronous successive rectification regardless of word length.

Those skilled in the art will appreciate that the Gray code words output by the parallel synchronous successive rectification embodiment of the invention may be converted to binary code according to the techniques discussed with regard to FIGS. 1 and 2 herein. Preferably the conversion is accomplished through the use of exclusive NOR gates as seen in FIG. 3. Thus, the bit output of shift register $40a$ (the "msb") is taken intact, and is also used as an input into exclusive NOR gate 45. The other input into gate 45 is the bit output by shift register $40b$. If the msb is a zero, the bit output by shift register $40b$ is inverted by gate 45. If the msb is a one, the bit output by shift register $40b$ remains intact. Regardless, the output of gate 45 provides the second bit of the binary word and an input into exclusive NOR gate 46. Again, the output of the previous shift register (in this case $40b$) determines whether the bit being output by shift register $40c$ is to be inverted or not, and the output of gate 46 is used as the third bit of the binary word and an input into yet another exclusive NOR gate. Those skilled in the art will appreciate that $n-1$ exclusive NOR gates are used to convert the Gray code output of the invention into a binary output word of n bits.

There has been described and illustrated herein apparatus for converting analog signals into digital signals. While particular embodiments of the invention have been described, it is not intended that the invention be limited thereby, as it is intended that the invention be broad in scope and that the specifications be read likewise. For example, while particular logic circuitry was supplied for the parallel synchronous converter embodiment, different logic providing similar results could be easily constructed. Further, it should also be recognized that the A/D converter of the invention may be realized in many different forms. For example, discrete components may be used for each of the described devices. Or, if desired, components may be partially or fully integrated into an integrated circuit. Therefore, it will be apparent to those skilled in the art that other changes and modifications may be made to the invention as described in the specification without departing from the spirit and scope of the invention as claimed.

I claim:

1. An apparatus for the analog to digital conversion of signal, comprising:
   (a) a plurality of stages for performing the conversion algorithm $V_{out}=2|V_{in}|-V_{ref}$, wherein $V_{in}$ is the voltage at the input of a particular stage, $V_{out}$ is the voltage at the output of that stage and becomes the $V_{in}$ to the following stage, and $V_{ref}$ is a chosen reference voltage, each stage comprising
     (i) a comparator means for comparing $V_{in}$ with a second reference voltage for obtaining a bit of information,
     (ii) a first input sampling capacitor,
     (iii) a second feedback capacitor, wherein the capacitance of said first input sampling capacitor is twice that of said feedback capacitor,
     (iv) a third switch capacitor,
     (v) a switching network for permitting the charging and discharging of said input sampling capacitor, said feedback capacitor, and said switch capacitor according to predetermined clocking,
     (vi) an operational amplifier having said input sampling capacitor bridging its inverting and noninverting inputs via said switching network, and said feedback capacitor feeding back from the operational amplifier output to its inverting input, wherein
   said switching network is arranged to switch the connections of the plates of said input sampling capacitor to said operational amplifier inputs as a function of said clocking and said obtained bit of information from said comparator of said stage to effectuate rectification of $V_{in}$, and wherein said switching network is arranged to switch the connection of said switch capacitor as a function of said clocking from being connected to the output of said operational amplifier to being between the source of said chosen voltage reference and said inverting input of said operational amplifier, and
   (b) a plurality of shift registers, each shift register corresponding to a particular stage and having a storage capacity of m bits of information, where m is chosen from $0$ to $n-1$ and is the number of said particular stage with $n-1$ representing the most significant bit and $0$ representing the least significant bit, wherein n is the number of bits output by said analog to digital converter, wherein the output of said shift registers provides an output word in Gray code.

2. An apparatus according to claim 1, further comprising:
   (c) a last comparator means for comparing the voltage output of said last stage to said second reference voltage, and providing the least significant bit of information, wherein said output of said shift registers and said last comparator means provides said output word in Gray code.

3. An apparatus according to claim 2, further comprising:
   (d) means for converting said Gray code output word into a binary output word.

4. An apparatus according to claim 3, wherein:
   said means for converting said Gray code output comprises a plurality of exclusive NOR gates.

5. An apparatus according to claim 1, wherein:
   said second reference voltage is ground.

6. An apparatus for the analog to digital conversion of signal according to the conversion algorithm $V_{out}=2|V_{in}|-V_{ref}$, wherein $V_{in}$ is the voltage at the input of the apparatus, $V_{out}$ is the voltage at the output of the apparatus, and $V_{ref}$ is a chosen reference voltage, the apparatus comprising:
   (a) a comparator means for comparing $V_{in}$ with a second reference voltage for obtaining a bit of information,
   (b) a first input sampling capacitor, (c) a second feedback capacitor, wherein the capacitance of said first input sampling capacitor is twice that of said feedback capacitor, (d) a third switch capacitor, (e) a switching network for permitting the charging and discharging of said input sampling capacitor, said feedback capacitor, and said switch capacitor according to predetermined clocking, and (f) an operational amplifier having said input sampling capacitor bridging its inverting and noninverting inputs via said switching network, and said feedback capacitor feeding back from the operational amplifier output to its inverting input, wherein said switching network is arranged to switch the connections of the plates of said input sampling capacitor to said operational amplifier inputs as a function of said clocking and said obtained bit of information from said comparator to effectuate rectification of $V_{in}$, and wherein said switching network is arranged to switch the connection of said switch capacitor as a function of said clocking from being connected to the output of said operational amplifier to being between the source of said chosen voltage reference and said inverting input of said operational amplifier, and the voltage at the output of said operational amplifier is $V_{out}$ and may be compared by a comparator means to said second reference voltage to provide a second bit of information.

* * * * *